US009923086B2

(12) United States Patent
Cao et al.

(10) Patent No.: US 9,923,086 B2
(45) Date of Patent: Mar. 20, 2018

(54) CMOS DEVICE HAVING CARBON NANOTUBES

(71) Applicant: International Business Machines Corporation, Armonk, NY (US)

(72) Inventors: Qing Cao, Yorktown Heights, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/016,716

(22) Filed: Feb. 5, 2016

(65) Prior Publication Data

US 2016/0163842 A1    Jun. 9, 2016

Related U.S. Application Data

(62) Division of application No. 14/564,621, filed on Dec. 9, 2014, now Pat. No. 9,299,939.

(51) Int. Cl.

| *H01L 29/06* | (2006.01) |
|---|---|
| *H01L 29/775* | (2006.01) |
| *H01L 51/10* | (2006.01) |
| *H01L 29/12* | (2006.01) |
| *H01L 51/05* | (2006.01) |
| *H01L 51/00* | (2006.01) |

(52) U.S. Cl.
CPC ........ *H01L 29/775* (2013.01); *H01L 29/0669* (2013.01); *H01L 29/125* (2013.01); *H01L 51/105* (2013.01); *H01L 51/0023* (2013.01); *H01L 51/0048* (2013.01); *H01L 51/055* (2013.01); *H01L 51/0541* (2013.01); *H01L 51/0545* (2013.01)

(58) Field of Classification Search
CPC . H01L 29/775; H01L 29/0669; H01L 29/125; H01L 51/0023; H01L 51/0048; H01L 51/0541; H01L 51/055; H01L 51/105
USPC .............................................. 257/9
See application file for complete search history.

(56) References Cited

U.S. PATENT DOCUMENTS

| 6,342,195 B1 | 1/2002 | Roy et al. |
|---|---|---|
| 6,740,900 B2 | 5/2004 | Hirai |
| 6,842,328 B2 | 1/2005 | Schott et al. |
| 7,598,516 B2 | 10/2009 | Avouris et al. |
| 8,119,466 B2 | 2/2012 | Avouris et al. |
| 8,253,124 B2 | 8/2012 | Numata et al. |

(Continued)

FOREIGN PATENT DOCUMENTS

JP    01320210 A    12/1989

OTHER PUBLICATIONS

Iijiama et al, "Helical microtubules of graphitic carbon", Nature, vol. 354, Nov. 7, 1991, 1991 Nature Publishing Group, pp. 56-58.

(Continued)

*Primary Examiner* — Phat X Cao
*Assistant Examiner* — Mohammad M Hoque
(74) *Attorney, Agent, or Firm* — Erik K. Johnson

(57) ABSTRACT

A method, and the resulting structure, of making a CMOS device from carbon nanotube substrate, where a carbide contact is formed in a source drain region. The carbide is formed prior to the gate structure by reacting a glassy carbon and a metal.

14 Claims, 4 Drawing Sheets

(56) References Cited

U.S. PATENT DOCUMENTS

| 8,394,664 B2 | 3/2013 | Nicholas et al. | |
|---|---|---|---|
| 2004/0035355 A1 | 2/2004 | Avouris et al. | |
| 2006/0063318 A1 | 3/2006 | Datta et al. | |
| 2006/0151844 A1* | 7/2006 | Avouris | B82Y 10/00 257/411 |
| 2006/0273303 A1 | 12/2006 | Wu et al. | |
| 2006/0286755 A1 | 12/2006 | Brask et al. | |
| 2008/0119016 A1 | 5/2008 | Dubin et al. | |
| 2008/0290418 A1 | 11/2008 | Kalburge | |
| 2009/0114901 A1 | 5/2009 | Xie et al. | |
| 2010/0252802 A1 | 10/2010 | Numata et al. | |
| 2011/0087034 A1 | 4/2011 | Miyata et al. | |
| 2011/0227059 A1 | 9/2011 | Kim et al. | |
| 2012/0261643 A1* | 10/2012 | Cohen | B82Y 10/00 257/27 |
| 2012/0261754 A1 | 10/2012 | Cheng et al. | |
| 2013/0089956 A1* | 4/2013 | Chang | H01L 29/775 438/151 |

OTHER PUBLICATIONS

Bethune, et al., "Cobalt-catalysed growth of carbon nanotubes with single-atomic-layer walls", Nature, vol. 363, Jun. 17, 1993, 1993 Nature Publishing Group, pp. 605-607.

Botti, et al, "Carbon nanotubes and nanowires grown from spherical carbon nano-particles", Chemical Physics Letters, vol. 355, Apr. 8, 2002, pp. 395-399.

Botti, et al, "Photoluminescence from silicon nano-particles synthesized by laser-induced decomposition of silane", Journal of Applied Physics, vol. 88, No. 6, Sep. 15, 2000, doi: 10.1063/1.128822, pp. 3396-3401.

Cao et al., "Formation of CMOS Device Using Carbon Nanotube," U.S. Appl. No. 14/564,621, filed Dec. 9, 2014.

List of IBM Patents or Patent Applications Treated as Related, Feb. 3, 2016, 2 pgs.

* cited by examiner

CMOS DEVICE HAVING CARBON NANOTUBES

BACKGROUND

The present invention relates to a semiconductor structure and a method of fabricating the same. More particularly, the present invention relates to a complementary metal oxide semiconductor (CMOS) device, e.g., a field effect transistor (FET).

Besides exhibiting intriguing quantum behaviors even at room temperature, carbon-based nanotubes exhibit at least two important characteristics, a nanotube may be either metallic or semiconducting depending on its chirality, i.e., conformational geometry. Metallic nanotubes may carry an extremely large current density with constant resistivity. Semiconducting nanotubes may be electrically switched "on" or "off" as field effect transistors (FETs). The two types may be covalently joined (sharing electrons). These characteristics point to nanotubes as excellent materials for making nanometer-sized semiconductor circuits. Similar properties exist for other one-dimensional nanostructures.

Carbon-based nanotubes and other like one-dimensional nanostructures are thus becoming strategically important for post-Si FET scaling. However, there is no known self-aligned process comparable to conventional CMOS technology. A self-aligned process for a CMOS device including one-dimensional nanostructures would provide a simpler sequence of processing steps as compared to a non-self-aligned process and it reduces processing error that typically occurs when a non-self-aligned process is used. Moreover, a self-aligned process provides a structure having reduced parasitics as compared to a non-self-aligned structure.

BRIEF SUMMARY

An embodiment of the invention may include a method of forming a semiconductor comprising. The method may include forming a glassy carbon structure on a source/drain region of a carbon nanotube layer of a substrate. The substrate may include a carbon nanotube layer located on an insulating layer, and the insulating layer may be located on a bulk semiconductor. A dummy gate may be formed on the carbon nanotube layer in a gate region of the substrate. A metal layer may be formed on the glassy carbon structure and the dummy metal. A carbide structure may be formed from reacting the metal layer with the glassy carbon structure. The dummy gate may be replaced with a final gate.

An additional embodiment of the invention may include a method of forming a semiconductor comprising. The method may include forming a polymeric structure on a source/drain region of a carbon nanotube layer of a substrate, and annealing the polymeric structure to form a glassy carbon structure. The substrate may include a carbon nanotube layer located on an insulating layer, and the insulating layer may be located on a bulk semiconductor. A dummy gate may be formed on the carbon nanotube layer in a gate region of the substrate. A metal layer may be formed on the glassy carbon structure and the dummy metal. A carbide structure may be formed from reacting the metal layer with the glassy carbon structure. The dummy gate may be replaced with a final gate.

An additional embodiment of the invention may include a semiconductor structure having a carbide structure located in a source/drain region of a substrate. The semiconductor structure may have a carbon nanotube channel in a gate region of the substrate. The carbon nanotube channel may be in direct contact with the substrate. The semiconductor structure may include a gate located above the carbon nanotube channel in the gate region of the substrate.

BRIEF DESCRIPTION OF THE SEVERAL DRAWINGS

Figure 1:
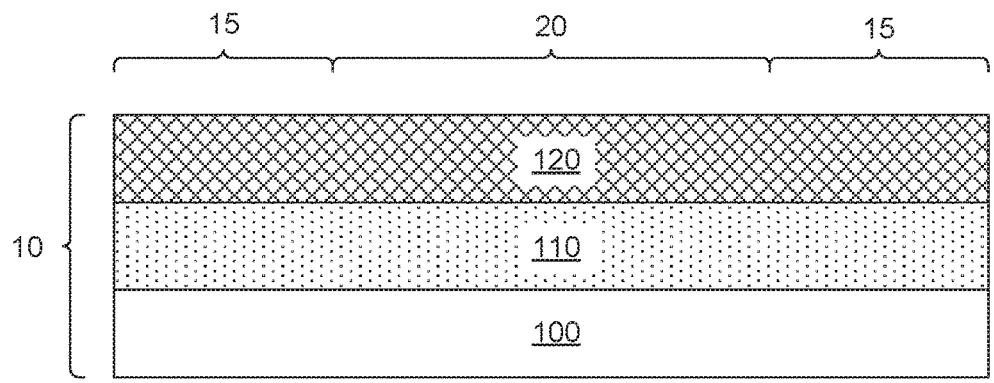
FIG. 1 is a cross-sectional view of a substrate containing a bulk substrate, an insulating layer, and a carbon nanotube layer, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The use of carbon nanotubes to create field effect transistors (FETs) may be useful in scaling down semiconductor structures. However, forming contacts that are able to withstand typical use and processing may not be possible using only the material located in the carbon nanotubes located on a substrate. In order to make more robust connections in the source/drain region of a device, a glassy carbon structure may first be deposited in the source/drain region of the substrate, and reacted with a metal, to from a metal-carbide connection in the source/drain region. The metal/carbide connection may act as a connection from conductive metal lines and vias placed above the structure to the carbon nanotubes located in the channel region of the device, and the use of a glassy carbon structure as a template for the junction region may create a more robust connection.

A substrate 10 shown in FIG. 1 is provided in which in order to form a field effect transistor (FET). The substrate 10 shown in FIG. 1 includes a semiconductor layer 100 which includes a dielectric layer 110 and nanostructure layer 120 thereon. The substrate 10 contains a source/drain region 15 and a gate region 20, where the resulting structures of a FET will be formed. The semiconductor layer 100 includes any type of semiconducting material including, but not limited to: Si, SiGe, SiC, SiGeC, GaAs, InAs, InP or any other III/V or II/VI compound semiconductor. The semiconductor layer 100 may also include a layered semiconductor such as, for example, Si/SiGe or Si/SiGeC. Alternatively, the semiconductor layer 100 may include a silicon-on-insulator (SOI) or a silicon germanium-on-insulator (SGOI). The semiconductor layer 100 may be undoped or doped with one or more doping regions at this point of the present invention. Also, the semiconductor layer 100 may be strained or unstrained and it may have any crystallographic orientation including, for example, (111), (110) or (100). Also, the semiconductor layer 100 may be used either for a back gate or for building other devices nearby (on the same chip or not) with conventional techniques.

In some embodiments of the present invention, when the dielectric layer 110 is thick, the semiconductor layer 100 may be replaced with a handling substrate such as a metal or glass. The present invention also contemplates embodiments when the entire substrate is included of the dielectric layer 110.

The dielectric layer 110 may include an oxide, a nitride, an oxynitride, a carbon containing dielectric such as, diamond like carbon (DLC) or fluorinated DLC, a high k dielectric (k greater than 4.0, typically greater than 7.0), an organic dielectric or multilayers thereof. In one embodiment, the dielectric layer 110 includes an oxide such as $SiO_2$ or a nitride such as $Si_3N_4$. In another embodiment, the dielectric layer 110 includes a DLC layer.

The dielectric layer 110 shown in FIG. 1 is formed on the surface of the semiconductor layer 100 utilizing a conventional deposition process such as, for example, chemical vapor deposition (CVD), plasma-enhanced chemical vapor deposition (PECVD), chemical solution deposition, sputtering, atomic layer deposition (ALD), physical vapor deposition (PVP), spin-on coating, epitaxial growth and other like deposition processing. In an alternate embodiment of the present invention, the dielectric layer 110 may also be formed by thermal oxidation, nitridation or oxynitridation.

The thickness of the dielectric layer 110 formed atop the semiconductor layer 100 may vary depending on the type of dielectric material employed as well as the technique that was used to form the same. Typically, the dielectric layer 110 has a thickness from about a fraction of a nanometer to about 500 nm, with a thickness from about 1 to about 10 nm being more typical. The aforementioned ranges are for semiconductor substrates and for back gate processes. For substrates without electrical functionality, the whole substrate may be a dielectric or the dielectric thickness may be extremely thick.

A layer of at least one one-dimensional nanostructure 120 (hereinafter "nanostructure layer 120") may be formed atop the dielectric layer 110. The nanostructure layer 120 may include a nanotube, a nanowire or a combination of these two types of nanomaterials. As stated above, nanotubes differ from nanowires because nanotubes typically have a hollow cavity, whereas nanowires are completely filled nanomaterials. One-dimensional nanostructures are structures with nanometer-sized diameters and much, much longer lengths. In other words, the structures have a high aspect ratio and quantum effects become important for these systems. The nanostructure layer 120 includes at least one nanotube or nanowire, and may be controlled to form a selected number of such one-dimensional nanostructures. Preferably, nanostructure layer 120 includes a plurality of one-dimensional nanostructures.

In an embodiment of the present invention, the nanostructure layer 120 may include nanotubes. In another embodiment of the present invention the nanostructure layer 120 may include nanowires.

The nanotubes that may be used in the present invention are single walled or multi-walled nanomaterials that have an outer diameter that is typically from about 0.4 nm to about 30 nm, with an outer diameter from about 0.8 nm to about 3 nm being more typical, and a length that is typically from about 5 nm to about 100 μm, with a length from about 10 nm to about 10 μm being more typical. In addition to having an outer diameter, the nanotubes that may be used in the present invention have an inner diameter that is typically from about 0.4 nm to about 15 nm, with an inner diameter from about 0.8 nm to about 3 nm being more highly typical. The nanotubes useful in the present invention are further characterized as having a high aspect ratio that is typically on the order of about 5 or greater, with an aspect ratio from about 5 to about 10000 being more typical.

The nanowires that may be used in the present invention include various atomic layers, i.e., more than one shell, in which the outer diameter is typically from about 0.4 nm to about 100 nm, with an outer diameter from about 0.8 nm to about 50 nm being more typical, and a length that is from about 5 nm to about 100 μm, with a length from about 10 nm to about 10 μm being more typical. The nanowires useful in the present invention are further characterized as having a high aspect ratio that is typically on the order of about 5 or greater, with an aspect ratio from about 5 to about 5000 being more typical.

The nanostructure layer 120 employed in the present invention typically includes a Carbon-based nanomaterial that has a hexagonal lattice structure. That is, the nanostructures of the present invention typically include carbon, e.g., graphite. Although Carbon-based nanomaterials are preferably used, the present invention also contemplates other types of nanomaterials such as metallic or a combination of Carbon-based and metallic.

The thickness of the nanostructure layer 120 formed at this point of the present invention may vary depending on the technique that was used to form the same. Typically, the nanostructure layer 120 has a thickness from about 0.4 to about 500 nm, with a thickness from about 0.8 to about 50 nm being more typical. In embodiments in which nanotubes are used, the nanostructure layer 120 typically has a thickness from about 0.8 to about 3 nm.

The nanostructure layer 120 may be formed utilizing techniques that are well known in the art. For example, carbon-based nanotubes may first be produced using arc-discharge, laser ablation of a carbon target, or chemical vapor deposition, then suspended in solvents, and then assembled on the target substrate. Alternatively, carbon-based nanotubes may also be made directly on the target substrate by chemical vapor deposition in the presence of metallic particles on the target substrate. Specific process details for nanotube formation that may be used in the present invention may be found, for example, in S. Iijima, et al. "Helical Microtubes of Graphite Carbon", Nature 354, 56 (1991); D. S. Bethune, et al. "Cobalt Catalyzed Growth of Carbon Nanotubes with Single-Atomic-Layer Walls" Nature 363, 605 (1993), and R. Saito, et al. "Physical Properties of Carbon Nanotubes", Imperial College Press (1998); the entire content of each is incorporated herein by reference. Also, the catalyst-free growth method disclosed in co-assigned U.S. Patent Application No. 2004/0035355 A1 may be used in fabricating nanotubes that may be used as nanostructure layer 120. The entire content of the '355 published application is also incorporated herein by reference. In one embodiment of the present invention, the layer of carbon nanotubes used for the nanostructure layer 120 is formed by chemical vapor deposition at 900° C. for 10 mm using Fe catalyst particles.

Carbon-based nanowires may also be produced by arc-discharge and laser ablation of a carbon target. Alternatively, carbon-based nanowires may be made by chemical vapor deposition in the presence of metallic particles. Specific process details for nanowire formation that may be used in the present invention may be found, for example, in S. Botti, et al., Chemical Physics Letters vol. 355, no. 5-6: 395-9, 8 Apr. 2002; the entire content of which is incorporated herein by reference. In one embodiment of the present invention, the layer of carbon nanowires used for the nanostructure layer 120 is formed utilizing laser-induced chemical vapor deposited amorphous hydrogenated carbon nanoparticles (from a mixture of ethylene and acetylene) as precursor (see, for example, S. Botti, et al, J. Appl. Phys. 88, 3396 (2000)), and depositing them onto a heated surface using the following conditions: a pressure of about 0.04 atmospheres, a substrate temperature of about 1100° C., a deposition time of about 90 min in an Ar carrier at a flow of about 300 sccm.

Along with the techniques illustrated above, the present invention also contemplates other techniques that are capable of forming nanostructures, such as nanostructure layer 120. For example, solution-phase decomposition, sol-gel electrophoresis, or wet-chemical, hydrothermal synthesis may be used in forming one-dimensional nanostructures.

Figure 2:
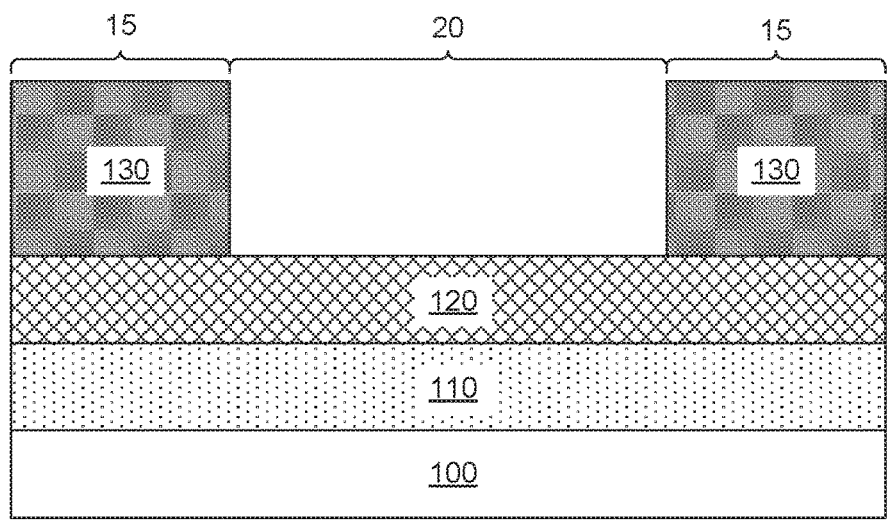
FIG. 2 is a cross-sectional view following formation of a glassy carbon on the source/drain region of the substrate, according to an exemplary embodiment.

Referring to FIG. 2, a glassy carbon structure 130 may be formed on the source/drain region 15 of the substrate 10. The glassy carbon structure 130 may be formed in order to create a much thicker contact region in the source/drain region 15 in order to withstand any damage that may occur during the manufacture of the semiconductor device. The glassy carbon structure 130 may be created by first patterning a carbon containing photoresist in the source/drain region 15, and annealing the photoresist to create a glassy carbon structure 130. In an exemplary embodiment, the carbon containing photoresist may be a phenol-containing polymer such as, for example, phenol-formaldehyde resin. Following the patterning of the carbon containing photoresist, the structure may be annealed, during a glassy carbon anneal, to convert the carbon containing photoresist into a glassy carbon structure. The annealing step used at this point of the present invention to cause carbide region 210 formation is performed at a temperature of about 600° C. or greater. Typically, the glassy carbon anneal is performed at a temperature from about 750° to about 1100° C. The glassy carbon formation anneal is performed in an inert ambient such as He, Ar, Ne, Kr, Xe, $N_2$ or mixtures thereof such as He—Ar or may be formed in a reducing environment such as $H_2$ or forming gas. The anneal is performed for a time period of sub-milliseconds or greater, with an annealing time from about 10 sec to about 30 min being more typical. The very short time anneal are achieved using laser annealing. The annealing may be performed utilizing a single annealing temperature or multiple annealing temperatures may be used. The annealing may also include various ramp-up cycles, soak cycles, and cool down cycles, as desired. Following the glassy carbon anneal, the glassy carbon structure 130 may have a thickness of approximately, 5 to 100 nm.

Figure 3:
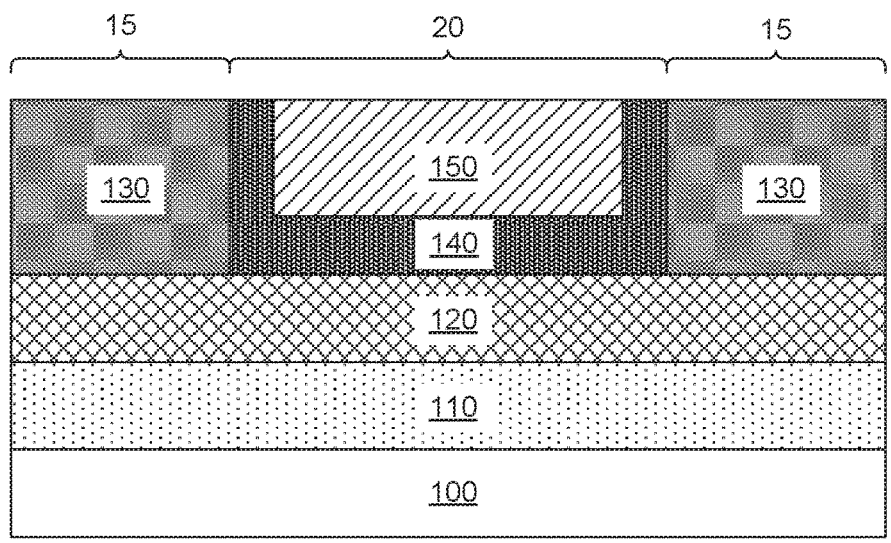
FIG. 3 is a cross-sectional view following formation of a dummy dielectric and a dummy metal on the gate region of the substrate, according to an exemplary embodiment.

Referring to FIG. 3, a dummy gate, containing a dummy dielectric 140 and a dummy metal 150 may be formed in the gate region 20 above the nanostructure layer 120. The dummy dielectric 140 may be made of any suitable insulating material, such as silicon nitride, silicon oxide, silicon oxynitrides, or a combination thereof, and may have a thickness ranging from 2 nm to approximately 100 nm. In a preferred embodiment, the dummy dielectric 140 may be made of silicon nitride and have a thickness ranging from approximately 2 nm to approximately 25 nm. The dummy dielectric 140 may be formed by any method known in the art, including depositing a conformal silicon nitride layer covering the surface of the entire structure. Further, in various embodiments, the dummy dielectric 140 may include one or more layers. In an exemplary embodiment, the dummy dielectric 140 may be made of a polysilicon material with a sacrificial dielectric material (e.g. silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

The dummy metal 150 may be made of any suitable sacrificial material, for example, amorphous or polycrystalline silicon. The dummy metal 150 may have any thickness ranging from approximately 30 nm to approximately 200 nm. The dummy metal 150 may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition of the dummy metal 150 above the dummy dielectric 140, CMP may be performed to remove material deposited on the glassy carbon structure 130, so the dummy metal 150 above the dummy dielectric 140 are located only in the gate region 20.

Figure 4:
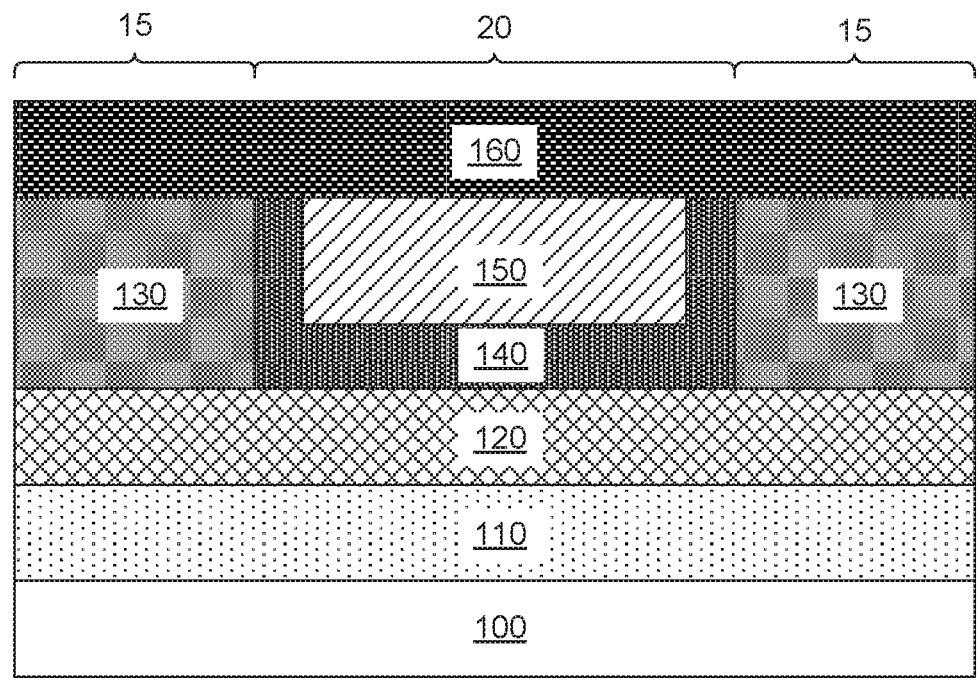
FIG. 4 is a cross-sectional view following formation of a metal layer above the source/drain region and the gate region, according to an exemplary embodiment.

Now referring to FIG. 4, a metal layer 160 is formed at least atop the glassy carbon structure 130 that was previously formed in FIG. 2. The metal layer 160 is formed so that it may react with the glassy carbon structure 130, and form a subsequent metal-carbide compound. The metal layer 160 includes any metal or metal-like element that may react with carbon to form a stable binary metal carbide. Alternatively, the metal may include C and optionally other elements. Examples of such metals include: Al, Si, Sc, Ti, V, Cr, Mn, Fe, Y, Zr, Nb, Mo, Hf, Ta, W and mixtures or alloys thereof. In a preferred embodiment, at least one of Al, Ti, Cr, Mo, W, Zr, Hf or Ta is used as the metal layer 160. The compound formation may be performed in different atmospheres such as, for example, nitrogen, forming gas, chloride, bromide, fluoride, oxygen and others. The variation of ambient gases allows for the formation of different conductive compounds. The metal layer 160 is formed in the present invention utilizing a conformal deposition process, such as, for example, CVD, PECVD, chemical solution deposition, ALD, sputtering, plating, evaporation or other like processes. The thickness of the metal layer 160 may vary depending on the metal used as well as the technique that was used to form the same. Typically, the thickness of the metal layer 160 is from about 3 to about 200 nm, with a thickness from about 5 to about 50 nm being more typical.

Figure 5:
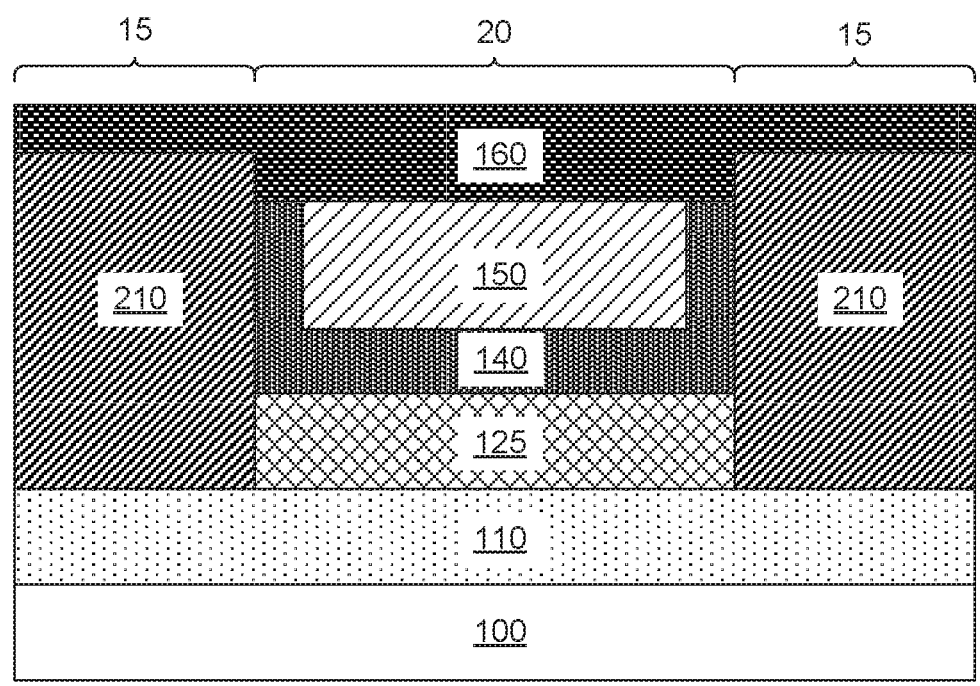
FIG. 5 is a cross-sectional view following formation of a carbide in the source drain region, according to an exemplary embodiment.

Referring now to FIG. 5, after forming the metal layer 160, the structure is subjected to an annealing step to cause reaction of the metal layer 160 with the glassy carbon structure 130, as well as the nanostructure layer 120 located in the source/drain region 15. The reaction between the metal layer 160 and the glassy carbon structure 130 may result in a carbide region 210 having a carbon-metal crystal lattice. As shown, a carbide region 210 forms adjacent to the dummy gate, as the metal from the metal layer 160 diffuses through the glassy carbon structure 130 and the nanostructure layer 120 in the source/drain region 15. Additionally, a portion of the metal layer in the source/drain region 15 may become part of the carbide region 210 as carbon may migrate into the metal layer 160 from the glassy carbon structure 130. The carbide region 210 is in direct contact with a vertical surface of the dummy gate, as well as the nanostructure layer 120 in the gate region 20 (hereinafter "nanostructure channel" 125). The nanostructure channel 125 is located between the dummy gate and dielectric layer 110, and may serve as the device channel for the resulting FET structure. Note that the annealing step may leave some of the metal layer 160 on the structure.

The annealing step used at this point of the present invention to cause carbide region 210 formation is performed at a temperature of about 600° C. or greater. Typically, the metal-carbide formation anneal is performed at a temperature from about 750° to about 1100° C. The metal-carbide formation anneal is performed in an inert ambient such as He, Ar, Ne, Kr, Xe, $N_2$ or mixtures thereof such as He—Ar. The anneal is performed for a time period of sub-milliseconds or greater, with an annealing time from about 10 sec to about 30 min being more typical. The very short time anneal are achieved using laser annealing. The annealing may be performed utilizing a single annealing temperature or multiple annealing temperatures may be used. The annealing may also include various ramp-up cycles, soak cycles, and cool down cycles, as desired.

Figure 6:
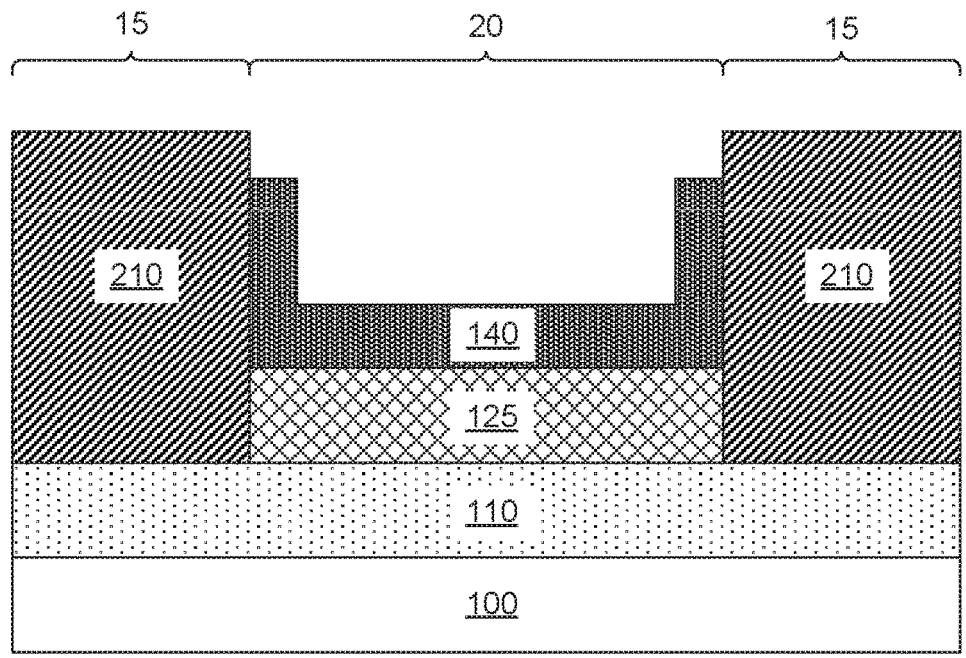
FIG. 6 is a cross-sectional view following removal of the unreacted metal layer and the dummy metal, according to an exemplary embodiment.

Referring now to FIG. 6, after forming the carbide region 210, the remaining metal layer 160 is removed from the structure utilizing an etching process that selectively removes metal as compared with metal carbide. Removal of the remaining metal layer 160 may be accomplished through any combination of known techniques, such as, for example, RIE, wet stripping and plasma etching.

Figure 7:
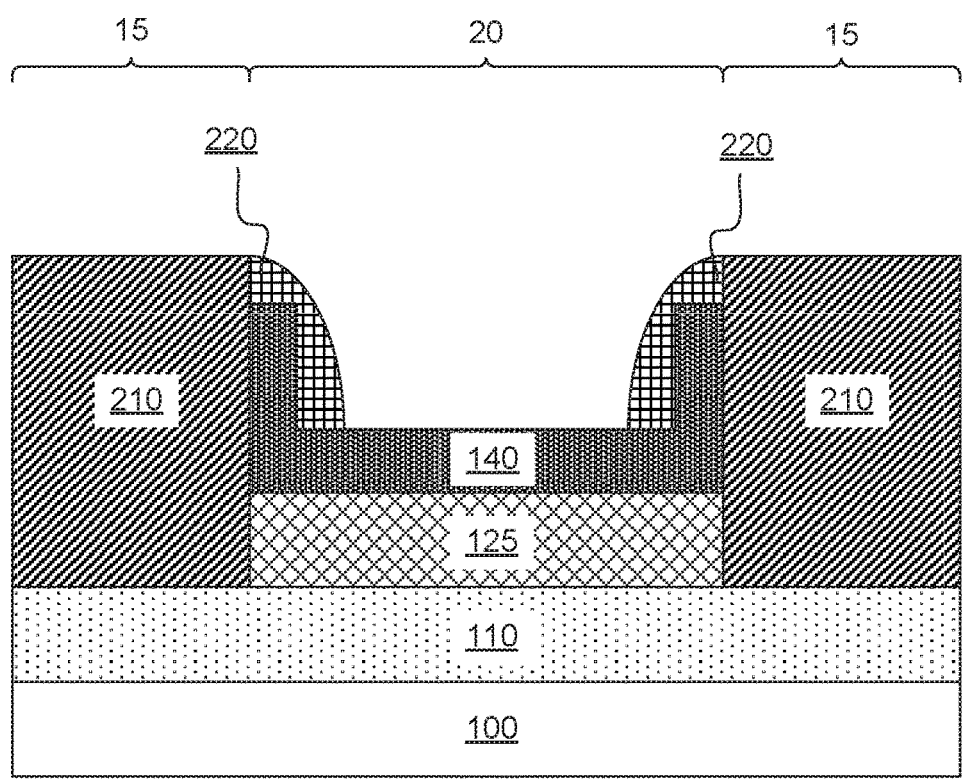
FIG. 7 is a cross-sectional view following formation of spacers, according to an exemplary embodiment.

Next, and as shown in FIG. 7 the spacers 220 may be made of any insulating material, such as silicon nitride, silicon oxide, silicon oxynitrides, or a combination thereof, and may have a thickness ranging from 1 nm to approximately 100 nm, preferably approximately 1 nm to approximately 25 nm. The spacers 220 may be formed by any method known in the art, including depositing a conformal silicon nitride layer over the structure and removing unwanted material using an anisotropic etching process such as, for example, reactive ion etching (ME) or plasma etching (not shown).

Figure 8:
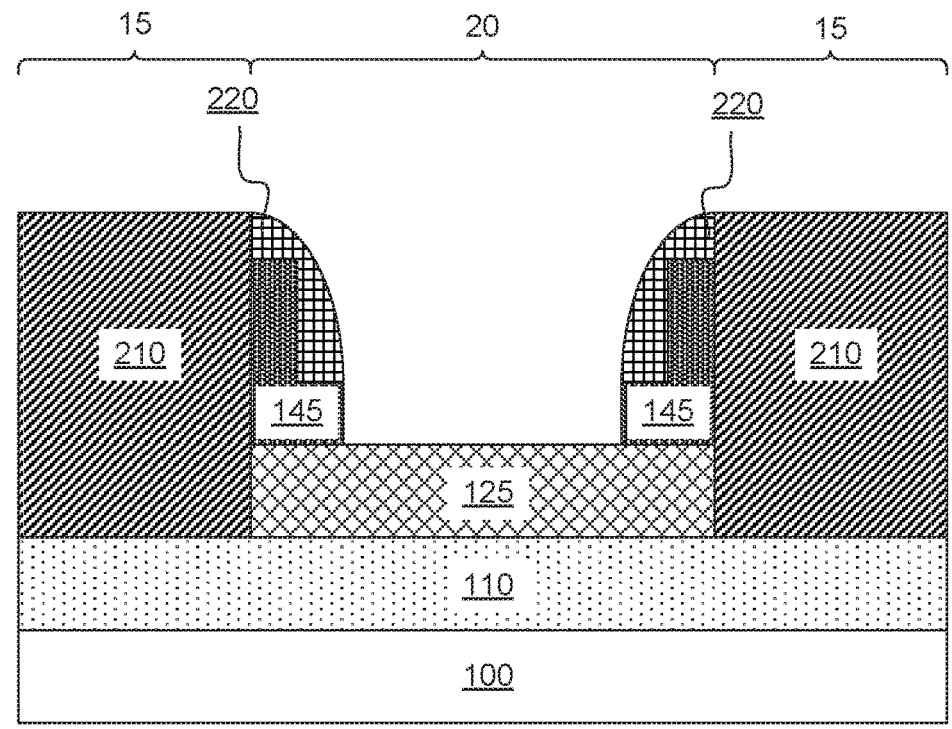
FIG. 8 is a cross-sectional view following removal of a portion of the dummy dielectric, according to an exemplary embodiment.

Referring to FIG. 8 is removing a portion of the dummy dielectric 140 may be performed by etching the exposed portion in the gate region, to form remnant dielectric layers 145. The etch may be any etch that selectively removes the dummy dielectric 140 with respect to the spacer 220 and the carbide layer 210. For example, an anisotropic etching process such as, for example, reactive ion etching (RIE) or plasma etching (not shown), may be used to selectively etch the dummy dielectric 140. Following the etch, the remnant dielectric 145 is located between the spacer 220 and the carbide region 210, as well as between the spacer 220 and the nanostructure channel 125.

Figure 9:
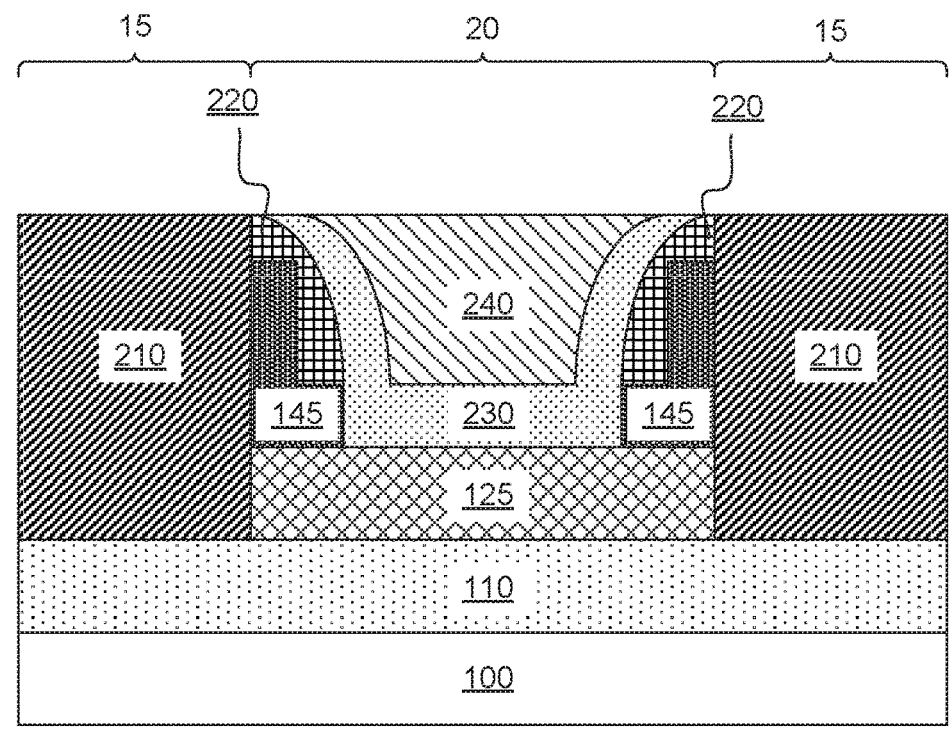
FIG. 9 is a cross-sectional view following formation of a gate dielectric and a gate metal in the source drain region, according to an exemplary embodiment.

Referring to FIG. 9, a gate dielectric 230 is formed on the surface of the nanostructure layer 120 and a gate electrode 240 is formed above the gate dielectric 230. In embodiments in which the at least one one-dimensional nanostructure is formed directly within a semiconductor substrate, the gate dielectric 230 may be formed by a thermal growing process such as, for example, oxidation, nitridation or oxynitridation. Alternatively, the gate dielectric 230 may be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 230 may also be formed utilizing any combination of the above processes. The gate dielectric 230 is included of an insulating material including, but not limited to: an oxide, nitride, oxynitride and/or silicate including metal silicates and nitrided metal silicates. In one embodiment, it is preferred that the gate dielectric 230 is included of an oxide such as, for example, $SiO_2$, $HfO_2$, $ZrO_2$, $Al_2O_3$, $TiO_2$, $La_2O_3$, $SrTiO_3$, $LaAlO_3$ or mixtures thereof. The thickness of the gate dielectric 230 may vary, but typically, the gate dielectric 230 has a thickness from about 0.5 to about 100 nm, with a preferred thickness from about 0.5 to about 10 nm.

After forming the gate dielectric 230, a blanket layer of a gate electrode 240 is formed on the gate dielectric 230 utilizing a known deposition process such as, for example, physical vapor deposition, CVD or evaporation. The thickness, i.e., height, of the gate electrode 240 deposited at this point of the present invention may vary-depending on the deposition process employed. Typically, the gate electrode 240 has a vertical thickness from about 5 to about 180 nm, with a thickness from about 5 to about 50 nm being more typical. The gate electrode 240 may include any conductive material that is typically employed as a gate of a CMOS structure. Illustrative examples of such conductive materials that may be employed as the gate electrode 240 include, but are not limited to: polysilicon, conductive metals, conductive metal alloys, conductive silicides, conductive nitrides, polySiGe or combinations thereof, including multilayers thereof. In some embodiments (not shown), a gate cap included of an oxide or nitride may be formed atop the gate electrode 240. Also, it is possible to form a barrier layer between multiple layers of gate electrode materials. Following the deposition of the gate electrode 240 above the gate dielectric 230, CMP may be performed to remove material deposited on the carbide region 210, so the gate electrode 240 above the gate dielectric 230 are located only in the gate region 20.

Following CMP, a structure may exist where at least one carbide region 210 is located directly on a dielectric layer 110 in a source/drain region 15, and a nanostructure channel 125 is located between two carbide regions 210, directly on a dielectric layer 110, in a gate region 20. The carbide regions 210 and the nanostructure channel 125 may contact at the interface between the source/drain region 15 and the gate region 20, and the carbide region 210 may serve as a junction between the nanostructure channel 125, and conductive structures that may be subsequently formed. A remnant dielectric layer 145 may be located between a spacer 220 and the nanostructure channel 125, as well as between the spacer 220 and the carbide region 210, and the edge of the remnant dielectric layer 145 may define the edge of the gate region 20. The gate spacer located on the dielectric layer 145 may define the rest of the gate region 20 above the dielectric layer 145. A gate dielectric 230 may be located in the gate region 20, directly above the nanostructure channel 125, and in direct contact with the inner edge of the spacer 220 and the remnant dielectric layer 145. A gate electrode 240 may be located in the gate region 20, above the gate dielectric 230. The gate electrode 240 and gate dielectric 230 may form a gate structure, and the carbide regions 210 may be even with the gate structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
   a carbide structure located in a source/drain region of a substrate;
   a carbon nanotube channel in a gate region of the substrate, wherein the carbon nanotube channel is in direct contact with the substrate;
   a gate located above the carbon nanotube channel in the gate region of the substrate, wherein a top surface of the gate is substantially co-planar with a top surface of the carbide structure; and
   a dielectric spacer located above the carbon nanotube channel and between the carbide structure and the gate, wherein a vertical dielectric surface formed between the dielectric spacer and the carbide structure extends from the carbon nanotube channel to the top surface of the carbide structure, and wherein the vertical dielectric surface is substantially vertical.

2. The semiconductor structure of claim 1, wherein the carbide structure comprises a carbon-metal crystal lattice.

3. The semiconductor structure of claim 2, wherein the metal of the carbon metal lattice comprises Aluminum, Titanium, Chromium, Molybdenum, Tungsten, Zirconium, Hafnium, or Tantalum.

4. The semiconductor structure of claim 2, wherein the carbide structure contains a uniform concentration of carbon.

5. The semiconductor structure of claim 2, wherein the carbide structure comprises a uniform concentration of metal.

6. The semiconductor structure of claim 1, wherein the substrate comprises a dielectric layer located above a semiconductor layer, and wherein the carbide structure and carbon nanotube channel are in direct contact with the dielectric layer.

7. The semiconductor structure of claim 1, wherein the carbide structure is in direct contact with the carbon nanotube channel.

8. The semiconductor structure of claim 1, wherein the carbide structure is in direct contact with the top surface of the substrate.

9. The semiconductor structure of claim 1, wherein the gate comprises a dielectric layer and metal layer, wherein the dielectric layer is located between the metal layer and the carbide structure, and wherein the dielectric layer is located between the metal layer and the carbon nanotube channel.

10. A semiconductor structure comprising:
    a carbide structure located in a source/drain region of a substrate, wherein only the carbide structure is in direct contact with the top surface of the substrate in the source/drain region of the substrate, wherein the carbide structure contains a uniform concentration of carbon and a metal;
    a carbon nanotube channel in a gate region of the substrate, wherein the carbon nanotube channel is in direct contact with the substrate;
    a gate located above the carbon nanotube channel in the gate region of the substrate, wherein the gate comprises a dielectric layer and metal layer, wherein the dielectric layer is located between the metal layer and the carbide structure, and wherein the dielectric layer is located between the metal layer and the carbon nanotube channel, and wherein a top surface of the gate is substantially co-planar with a top surface of the carbide structure; and
    a dielectric spacer located above the carbon nanotube channel and between the carbide structure and the dielectric layer, wherein a vertical dielectric surface formed between the dielectric spacer and the carbide structure extends from the carbon nanotube channel to the top surface of the carbide structure, and wherein the vertical dielectric surface is substantially vertical.

11. The semiconductor structure of claim 10, wherein the carbide structure comprises a carbon-metal crystal lattice.

12. The semiconductor structure of claim 11, wherein the metal of the carbon metal lattice comprises Aluminum, Titanium, Chromium, Molybdenum, Tungsten, Zirconium, Hafnium, or Tantalum.

13. The semiconductor structure of claim 10, wherein the substrate comprises a dielectric layer located above a semiconductor layer, and wherein the carbide structure and carbon nanotube channel are in direct contact with the dielectric layer.

14. The semiconductor structure of claim 10, wherein the carbide structure is in direct contact with the carbon nanotube channel.

* * * * *